(12) United States Patent
Mizuno et al.

(10) Patent No.: US 11,676,935 B2
(45) Date of Patent: Jun. 13, 2023

(54) BONDING METHOD AND STRUCTURE

(71) Applicants: WASEDA UNIVERSITY, Tokyo (JP); HARIMA CHEMICALS, INC., Hyogo (JP)

(72) Inventors: Jun Mizuno, Tokyo (JP); Hiroyuki Kuwae, Tokyo (JP); Kosuke Yamada, Tokyo (JP); Masami Aihara, Ibaraki (JP); Takayuki Ogawa, Ibaraki (JP)

(73) Assignees: WASEDA UNIVERSITY, Tokyo (JP); HARIMA CHEMICALS, INC., Hyogo (JP)

( * ) Notice: Subject to any disclaimer, the term of this patent is extended or adjusted under 35 U.S.C. 154(b) by 26 days.

(21) Appl. No.: 17/612,445

(22) PCT Filed: Apr. 3, 2020

(86) PCT No.: PCT/JP2020/015274
§ 371 (c)(1),
(2) Date: Nov. 18, 2021

(87) PCT Pub. No.: WO2020/241047
PCT Pub. Date: Dec. 3, 2020

(65) Prior Publication Data
US 2022/0246575 A1     Aug. 4, 2022

(30) Foreign Application Priority Data
May 27, 2019 (JP) .............................. JP2019-098223

(51) Int. Cl.
*H01L 21/52* (2006.01)
*H01L 23/00* (2006.01)

(52) U.S. Cl.
CPC .............. *H01L 24/80* (2013.01); *H01L 24/08* (2013.01); *H01L 2224/08145* (2013.01); *H01L 2224/80895* (2013.01)

(58) Field of Classification Search
CPC combination set(s) only.
See application file for complete search history.

(56) References Cited

U.S. PATENT DOCUMENTS

2005/0003652 A1*  1/2005  Ramanathan .......... H01L 24/16
                                                    257/E21.705

FOREIGN PATENT DOCUMENTS

| JP | 10-092702   | 4/1998 |
|----|-------------|--------|
| JP | 2010-046696 | 3/2010 |
| JP | 2018-085535 | 5/2018 |

OTHER PUBLICATIONS

ISR issued in WIPO Patent Application No. PCT/JP2020/015274, Jun. 23, 2020, English translation.

(Continued)

*Primary Examiner* — Niki H Nguyen
(74) *Attorney, Agent, or Firm* — Greenblum & Bernstein, P.L.C.

(57) ABSTRACT

A bonding method is capable of realizing high bonding strength and connection reliability even at a connection part in a high temperature area by means of simple operation low temperature bonding. The method includes a first step wherein, on at least one of the bonded surfaces of two materials to be bonded having a smooth surface, a thin film of noble metal with a volume diffusion coefficient greater than that of the base metal of the material to be bonded is formed using an atomic layer deposition method at a vacuum of 1.0 Pa or higher, a second step wherein a laminate is formed by overlapping the two materials to be bonded so that the bonded surfaces of the two materials are connected through the thin film, and a third step wherein the two materials to be bonded are bonded by holding the laminate at a predetermined temperature.

6 Claims, 4 Drawing Sheets

(56) References Cited

OTHER PUBLICATIONS

Communication to JPO in Japanese Patent Application No. 2019-98223, Submission of proof of Exception to loss of novelty, dated Jun. 18, 2019, English translation.
Communication from JPO in Japanese Patent Application No. 2019-98223, Receipt of Submission of proof of Exception to loss of novelty, dated Jun. 18, 2019, English translation.
Communication to JPO in Japanese Patent Application No. 2019-98223, Proof to be applied of the provisions of the exception to loss of novelty of the invention, The 79th Japan Society of Applied Physics Autumn meeting, signed by Harima Chemicals, Inc., dated Jun. 10, 2019, English translation.
Communication to JPO in Japanese Patent Application No. 2019-98223, Proof to be applied of the provisions of the exception to loss of novelty of the invention, The 79th Japan Society of Applied Physics Autumn meeting, signed by Waseda University, dated Jun. 5, 2019, English translation.
Communication to JPO in Japanese Patent Application No. 2019-98223, Proof to be applied of the provisions of the exception to loss of novelty of the invention, website of the 79th the Japan Society of Applied Physics Autumn meeting Proceeding, signed by Harima Chemicals, Inc., dated Jun. 10, 2019, English translation.
Communication to JPO in Japanese Patent Application No. 2019-98223, Proof to be applied of the provisions of the exception to loss of novelty of the invention, website of the 79th the Japan Society of Applied Physics Autumn meeting Proceeding, signed by Waseda University, dated Jun. 5, 2019, English translation.

* cited by examiner

Fig. 1
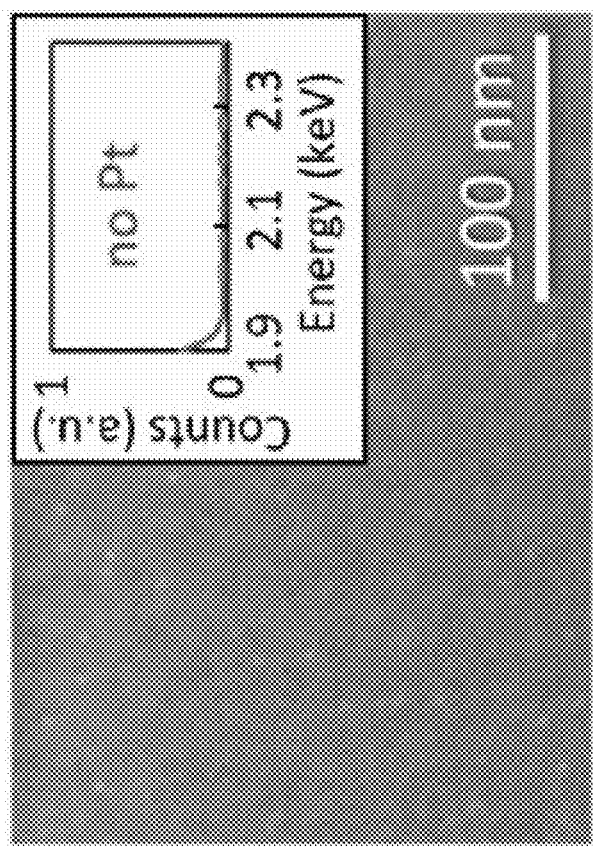
(b)
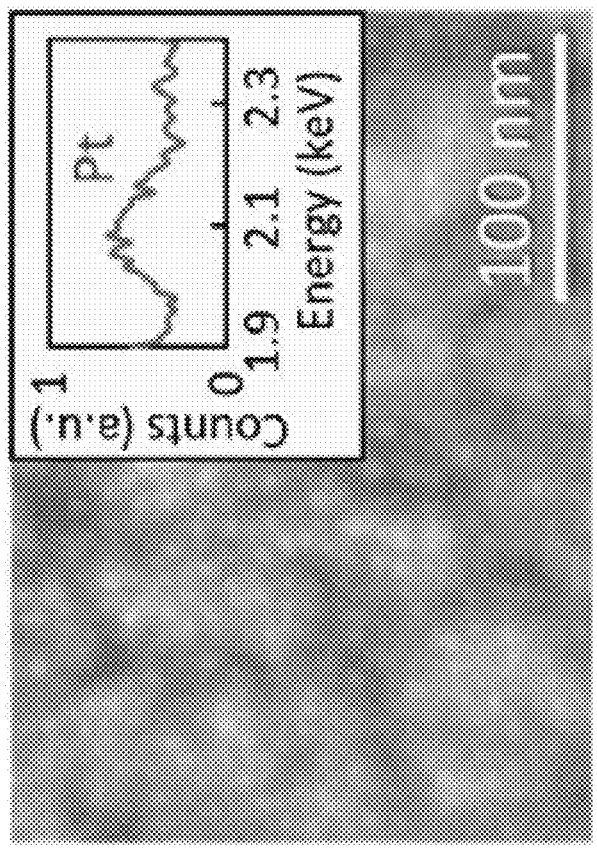
(a)

BONDING METHOD AND STRUCTURE

TECHNICAL FIELD

The present invention relates to a bonding method using a metal thin film by an atomic layer deposition method, and to a structure and a bonding material using the bonding method.

Conventionally, low-temperature and efficient bonding technology has been emphasized as a mounting technology for highly integrated semiconductor devices (semiconductor equipment). However, due to the natural oxide film and low diffusion coefficient of metals commonly used for bonding, high-temperature heating processes and pressure deformation are required during the bonding process. These requirements require high energy and cause deterioration in the reliability of semiconductor devices, such as the formation of a brittle compound layer at the bonding interface, thermal strain, and residual stress. In addition, this method cannot be applied to the bonding of substrates, where there are concerns about damage to semiconductor devices and their peripheral circuits, which are vulnerable to heat and pressure, and the choice of materials to be used is limited. Therefore, there is a need for a bonding technology that does not cause physical damage to semiconductor devices or their peripheral circuits and does not require high energy.

On the other hand, with the recent technological progress in the field of power semiconductors, it is expected to realize power devices with high energy-saving effects, such as highly reliable semiconductor devices that can be used at higher temperatures. Although lead solder has been widely used for the connection of metals and semiconductors, etc., which can be used in the high temperature range, from the viewpoint of environmental regulations, etc., there is a need for a bonding technology that does not contain lead and is inexpensive.

As a technique for bonding materials to be bonded together at room temperature and under no or low pressure, the bonded surfaces of the materials to be bonded are irradiated with an ion beam of rare gases, etc., to remove oxides, organics, etc., on the bonded surfaces, and the atoms on the surfaces of the materials to be bonded are made active so that they can easily form chemical bonds, and then the surfaces are superimposed on each other to enable bonding at room temperature. The room temperature bonding method (see, for example, Patent Document 1) is disclosed. In addition, an atomic diffusion bonding method (see, for example, Patent Document 2) is disclosed in which a microcrystalline continuous thin film is formed on the bonded surfaces of the materials to be bonded using a stable noble metal such as gold (Au) or a material having a large diffusion coefficient such as tin (Sn), and the two materials to be bonded are superimposed through the thin film to produce atomic diffusion at the bonding interface and grain boundary, thereby bonding the materials to be bonded at a low temperature.

CITATION LIST

Patent Literature 1

[PTL 1] Japanese Patent Application Laid-Open No. H 10-092702

[PTL 2] Japanese Patent Application Laid-Open No. 2010-046696

SUMMARY OF INVENTION

Technical Problem

However, in the bonding method described in Patent Document 1 and Patent Document 2, prior to the process of overlapping the bonded surfaces of the materials to be bonded, it is necessary to apply surface treatment to the bonded surfaces of the materials to be bonded and their surrounding areas by plasma, sputtering, etc., which can cause physical damage. In addition, the surface treatment requires a high vacuum environment of about $1 \times 10^{-4}$ to $1 \times 10^{-8}$ Pa, which prolongs the process time and increases the size of the manufacturing equipment.

In addition, since the microcrystalline continuous thin film formed on the bonded surface of the materials to be bonded is often a thick film, the amount of contamination of different metals and impurities in the base material of the materials to be bonded increases, and the electrical and mechanical properties of the resulting semiconductor device deteriorate. Furthermore, masks are essential for film deposition in specific areas.

The present invention has been proposed in consideration of the above points, and as an object thereof, in one aspect, it is to provide a bonding method capable of realizing high bonding strength and connection reliability even in a connection part in a high temperature area by means of simple operation low temperature bonding with highly productive equipment that causes little damage to the material to be bonded, does not require a high level of decompression process, and can be applied masklessly and area selectively.

Solution to Problem

The bonding method according to one form of the present invention is a first process of forming a thin film of a noble metal having a volume diffusion coefficient that is larger than a volume diffusion coefficient of a base material of the two materials to be bonded having smooth surfaces on at least one of the bonded surfaces of the two materials to be bonded using an atomic layer deposition method at a vacuum of 1.0 Pa or higher; and a second process of overlapping the two materials to form a laminate so that the bonded surfaces of the two materials are connected through the thin film; and holding the laminate at a predetermined temperature and bonding the two materials to be bonded; and a third process Includes.

Advantageous Effects of Invention

According to an embodiment of the present invention, in one aspect, a bonding method comprises a first step wherein, on at least one of the bonded surfaces of two materials to be bonded having a smooth surface, a thin film of noble metal with a volume diffusion coefficient greater than that of the base metal of the material to be bonded is formed using an atomic layer deposition method at a vacuum of 1.0 Pa or higher, a second step wherein a laminate is formed by overlapping the two materials to be bonded so that the bonded surfaces of the two materials are connected through the thin film, and a third step wherein the two materials to be bonded are bonded by holding the laminate at a predetermined temperature. According to an embodiment of the present invention, in one aspect, it is possible to provide a bonding method that can achieve high joint strength and connection reliability even in high temperature area connections by means of simple operation low temperature bonding with low damage to the material to be bonded, without requiring a high level of decompression process, maskless and area selective application, and high productivity equipment.

BRIEF DESCRIPTION OF THE DRAWINGS

FIG. 1 is SEM (scanning electron microscope) images and EDX (energy dispersive X-ray analysis) spectra of Cu and Si substrate surfaces after deposition of Pt ALD films.

DESCRIPTION OF EMBODIMENTS

Figure 2:
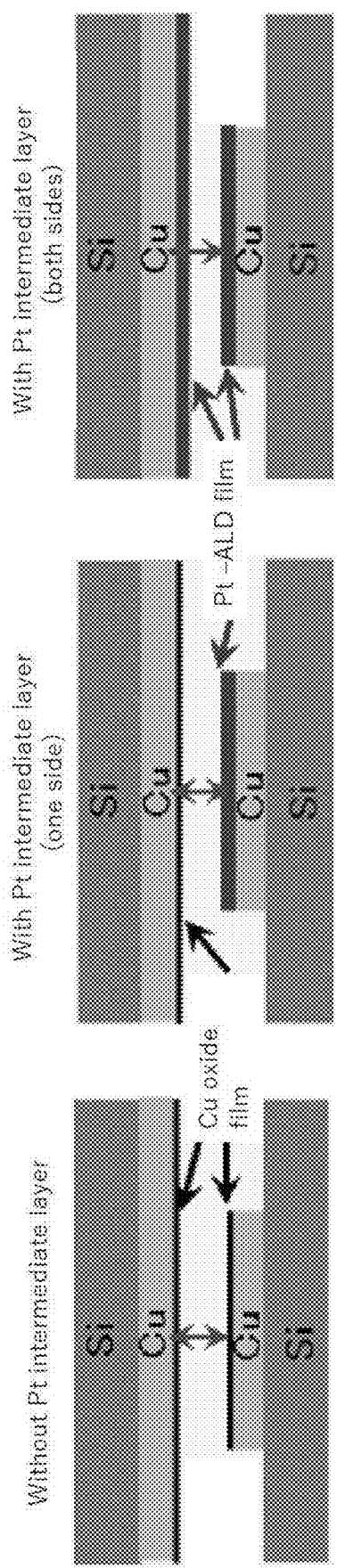
FIG. 2 is a schematic of the cross-section of the junction of the base materials after the deposition of platinum (Pt) atomic layer deposition (ALD) film.

The bonding method of this embodiment and the structure bonded by the bonding method are described in detail below.
(Bonding Method)
First, the bonding method pertaining to this embodiment will be described in detail. The bonding method according to the present embodiment comprises a first step wherein, on at least one of the bonded surfaces of two materials to be bonded having a smooth surface, a thin film of noble metal with a volume diffusion coefficient greater than that of the base metal of the material to be bonded is formed using an atomic layer deposition method at a vacuum of 1.0 Pa or higher, a second step wherein a laminate is formed by overlapping the two materials to be bonded so that the bonded surfaces of the two materials are connected through the thin film, and a third step wherein the two materials to be bonded are bonded by holding the laminate at a predetermined temperature.
(ALD Method)
In the first process of the bonding method of the present embodiment, an ALD method at a relatively low vacuum of 1.0 Pa or more is used. In this specification, the ALD method includes other ALD-based technologies and other equivalent or closely related technologies. Specifically, the Molecular Layer Deposition (Molecular Layer Deposition: MLD) technique and the like are mentioned.

Although the film growth mechanism by the ALD method is known to those skilled in the art, the ALD method is a chemical deposition method in which at least two reactive precursor species are sequentially introduced to the bonded surface of at least one junction material to form a film by sequential reactions. By exposing the bonded surface of the at least one material to be bonded to a time-fractured precursor pulse in a reaction vessel, a film material can be deposited on the bonded surface of the above material by a self-saturating surface reaction. The at least two reactive precursor species comprise a metal precursor and a corresponding reaction gas.

The degree of vacuum used in the film deposition process by the ALD method is a relatively low vacuum of 1.0 Pa or more, and does not require evacuation of a high vacuum up to $1 \times 10^{-3}$ Pa or less, which is generally used in sputtering and the like, which are physical film deposition methods. In addition, since the ALD method for this embodiment does not require physical treatment such as plasma or sputtering, there is no risk of physical damage to the bonded surface of the material to be bonded or its surrounding area. Furthermore, the ALD method is characterized by its ease of film formation control, such as film thickness control, and its ability to form a dense film without pinholes.

The deposition cycle of the ALD method consists of four successive steps, i.e., pulse A, purge A, pulse B and purge B. Pulse A is the step of feeding the first precursor vapor, and pulse B is the step of feeding the second precursor vapor. Purge A and Purge B are steps in which gaseous reaction byproducts and residual reactant molecules are removed from the reaction space, generally using inert gas and a vacuum pump.

One deposition sequence of the ALD method includes at least one deposition cycle, and the deposition cycles are repeated until a thin film (film) of a desired thickness is produced.

Next, each of the components used in the ALD method will be described.
(Metal Precursor)
The metal precursor for this embodiment is a metal precursor containing a noble metal having a volume diffusion coefficient that is greater than the volume diffusion coefficient of the base material of the material to be bonded. Specific examples of the metal precursor include Trimethyl (methylcyclopentadienyl) platinum (IV) complex, cyclooctadiene dimethyl platinum (II) complex, trimethylphosphine trimethyl gold (III) complex, dimethyl gold (III) diethyl dithiocarbamate complex, (bis(trimethylsilyl)amide)(triethylphosphine) gold(I) complex, precursors of precious metals as described in Atomic Layer Deposition of Noble Metals and Their Oxides (Chem. Mater. 2014, 26, pp. 786-801), and precursors of precious metals as described in Plasma-Assisted Atomic Layer Deposition: Basics, Opportunities, and Challenges (J. Vac. Sci. Technol. A, Vol. 29, No. 5, September/October 2011, pp. 050801-1-050801-26).
(Reaction Gas)
The reaction gas for this embodiment can be appropriately selected from among known reaction gases according to the type of the metal precursor described above. Specific examples of the reaction gas include oxygen, oxygen ions, hydrogen, and the like. In the case of forming an ALD film of a noble metal, a reaction gas such as oxygen or ozone can be used in addition to a reducing gas such as hydrogen, because an oxidizing gas such as ozone is a reducing agent for an organometallic compound that is a metal precursor.
(Bonding Process)
Next, each of the processes of the bonding method according to the present embodiment will be described in detail. As described above, the bonding method according to the present embodiment comprises a first step wherein, on at least one of the bonded surfaces of two materials to be bonded (metal or non-metal) having a smooth surface, a thin film of noble metal with a volume diffusion coefficient greater than that of the base metal of the material to be bonded is formed using an atomic layer deposition method (ALD method) at a vacuum of 1.0 Pa or higher, a second step wherein a laminate is formed by overlapping the two materials to be bonded so that the bonded surfaces of the two materials are connected through the thin film, and a third step wherein the two materials to be bonded are bonded by holding the laminate at a predetermined temperature.

Each process is described in detail below.
Process 1.
(The First Step)
The first step of the bonding method of this embodiment is a process wherein, on at least one of the bonded surfaces of two materials to be bonded (metal or non-metal) having a smooth surface, a thin film of noble metal with a volume diffusion coefficient greater than that of the base metal of the material to be bonded is formed using an atomic layer deposition method (ALD method) at a vacuum of 1.0 Pa or higher. Thereafter, the thin film formed by the ALD method in this embodiment is referred to as the ALD film.

The vacuum level when forming the ALD film in the first step is 1 Pa or higher, and as a specific example, is usually a low vacuum of 1 to 100 Pa, preferably 50 Pa or less, and more preferably 30 Pa or less.

The temperature at which ALD film is formed in the first step can be selected based on the vaporization temperature of the metal precursor and the reaction rate with the reaction gas, but is usually within the range of room temperature to 1000° C. for the material to be bonded and the peripheral materials in semiconductor devices.

The thickness of the ALD film formed in the first step is preferably 100 nm or less, more preferably 50 nm or less, even more preferably 20 nm or less, and most preferably 5 nm or less. By setting the thickness of the ALD film in the above range, after bonding, the amount of impurities in the base materials of the two materials to be bonded is significantly reduced, and pseudo-direct joining can be achieved. By setting the thickness of the ALD film in the above range, it is possible to ensure good bonding property in bonding of the materials to be bonded under low temperature conditions (e.g., from room temperature to about several hundred degrees Celsius). In addition, if the thickness of the ALD film exceeds 100 nm, the process time becomes longer, and therefore, it is preferable to set the thickness to 100 nm or less. In this embodiment, the film thickness of the ALD film is measured based on, for example, a scanning electron microscope image (SEM image).

In this embodiment, the ALD film formed in the first step can have area selectivity during the formation of the above thin film by controlling the selection of the metal species that forms the aforementioned ultra-thin film and the deposition time. For example, when platinum (Pt) is deposited on a silicon (Si) substrate with copper (Cu) bumps in a process at 270° C. under a vacuum of 30 Pa for 90 minutes (100 cycles) using the ALD method, Pt is preferentially deposited on the Cu surface. By using this area selectivity, it is possible to coat only the area of a specific material with the ALD film without using a mask from among the plurality of materials constituting a semiconductor device, etc., thereby simplifying the bonding process.

In this embodiment, the materials of the two materials to be bonded (referred to as the material to be bonded 1 and the material to be bonded 2) are not particularly limited, and various metal materials, semiconductor materials, ceramic materials or resin materials can be used. Specific examples of the material to be bonded 1 include a semiconductor substrate such as a silicon substrate; a metal substrate such as a copper substrate, a lead frame, a metal plate-attached ceramic substrate (e.g., Direct Bonding Copper: DBC substrate), a substrate for mounting a semiconductor device such as a Light Emitting Diode: LED package, a copper ribbon, a metal block, a power supply member such as a terminal, a heat sink, a water cooling plate, and the like can be mentioned. Specific examples of the material to be bonded 2 include power modules comprising diodes, rectifiers, thyristors, MOS gate drivers, power switches, power MOSFETs, Insulated Gate Bipolar Transistors: IGBTs, Schottky diodes, fast recovery diodes etc., transmitters, amplifiers, sensors, analog integrated circuits, semiconductor lasers, LED modules, and the like.

The material to be bonded 1 and the material to be bonded 2 may include a metal on the surface in contact with the ALD film of the present embodiment. The metals include copper, nickel, silver, gold, palladium, platinum, lead, tin, cobalt, manganese, aluminum, beryllium, titanium, chromium, iron, molybdenum, and alloys thereof.

(The Second Step 2)

The second step is a process of forming a laminate by overlapping two materials to be bonded so that the bonded surfaces of the two materials to be bonded are connected to each other via the ALD film formed in the first step.

The stacking method is not particularly limited, and includes a method using a chip mounter, flip chip bonder, or the like, and a method of manual placement using various jigs.

(The Third Step 3)

The third step is a process for bonding said two materials to be bonded by holding the laminate obtained in the second step at a predetermined temperature. More specifically, after the laminate obtained in the second process is transferred to the chamber, it is depressurized at or below atmospheric pressure and held at a predetermined temperature to cause atomic diffusion at the bonding interface of the ALD film to bond said two materials to be bonded.

The holding temperature in the third step can be set as appropriate according to the materials to be bonded and the surrounding materials, and is usually from room temperature to 1100° C., more preferably from 30 to 1000° C., and even more preferably from 35 to 900° C.

The holding time is not particularly limited as long as the volatilization of the dispersant and the fusion of the metal particles can be sufficiently advanced, but from the viewpoint of yield and process efficiency, 60 minutes or less is preferable.

In the third process, pressure may be applied in a direction perpendicular to the bonding interface of the two materials to be bonded for the purpose of assisting the bonding.

Example 1

Next, the bonding method of the present invention will be described below with reference to examples.

On a 12 mm×12 mm Si substrate, the resin PMGI manufactured by MicroChem Corp. was spin-coated at a thickness of 1 μm, followed by the photosensitive resin TSMR-V90 manufactured by TOKYO OHKA KOGYO CO., LTD. at a thickness of 1 μm.

Then, a through-hole pattern with a diameter of 8 μm was formed by local exposure with UV light and subsequent development. Then, a titanium film with a thickness of 30 nm and a copper film with a thickness of 500 nm were successively deposited by sputtering on the fabricated resin pattern. Finally, the copper bump pattern was formed by removing the resin using Remover PG, a dissolution solution manufactured by MicroChem Corp., to make the material to be bonded 1.

In addition, a titanium film with a thickness of 30 nm and a copper film with a thickness of 300 nm were continuously deposited directly on a 15 mm×15 mm silicon substrate to form material to be bonded 2, which is the bonded material substrate.

Then, using an atomic layer deposition system AT-400 of ANRIC TECHNOLOGIES LLC, the metal precursor was a trimethyl (methylcyclopentadienyl) platinum (IV) complex manufactured by Oakwood Products, Inc., and oxygen was used as the reductant gas, under the heating conditions of 30 Pa vacuum and 270° C., and the ALD deposition process treatment was carried out for 100 cycles in two patterns, one for the bonded surface of the above-mentioned material to be bonded 1 only and the other for both bonded surfaces of the above-mentioned materials 1 and 2 to be bonded.

FIG. 1 shows SEM (Scanning Electron Microscope) images and EDX (Energy Dispersive X-ray Analysis) spectra of Cu substrate surface and Si substrate surface after the deposition process of Pt ALD films.

As shown in FIG. 1, platinum (Pt) was deposited on the Cu surface with a thickness of 5 to 20 Å, while no Pt was observed on the Si substrate. In other words, it was confirmed that Pt ALD film could be selectively deposited without mask only on Cu, which is the junction of the materials to be bonded.

Next, the bonded surfaces of the two materials to be bonded were placed face to face and overlapped to form a laminate. The laminate was then transferred to a chamber, the chamber was depressurized to below atmospheric pressure, and the laminate was bonded by holding it at 300° C. for 15 minutes while applying a pressure of 100 MPa from a direction perpendicular to the bonding interface.

As a comparative example, the bonding of the comparative example was also carried out by the same method as the example except that the ALD deposition treatment of Pt was not carried out. FIG. 2 shows a schematic diagram of the cross-section of the bonding area of the base material after the ALD deposition of Pt in the Examples and Comparative Examples. The left figure in FIG. 2 is a schematic view of the cross-section of the bonding part of the comparative example, and the middle and right figures in FIG. 2 are schematic views of the cross-section of the bonding part of the example.

Example 2

A material to be bonded 1 and a material to be bonded 2 were bonded by the same method as in Example 1, except that an ALD film of gold (Au) was formed instead of an ALD film of Pt. For the ALD film of Au, trimethylphosphine trimethyl gold (III) complex was used as a precursor, and ozone and water vapor were used as reaction gases.

(Test Results)

Figure 3:
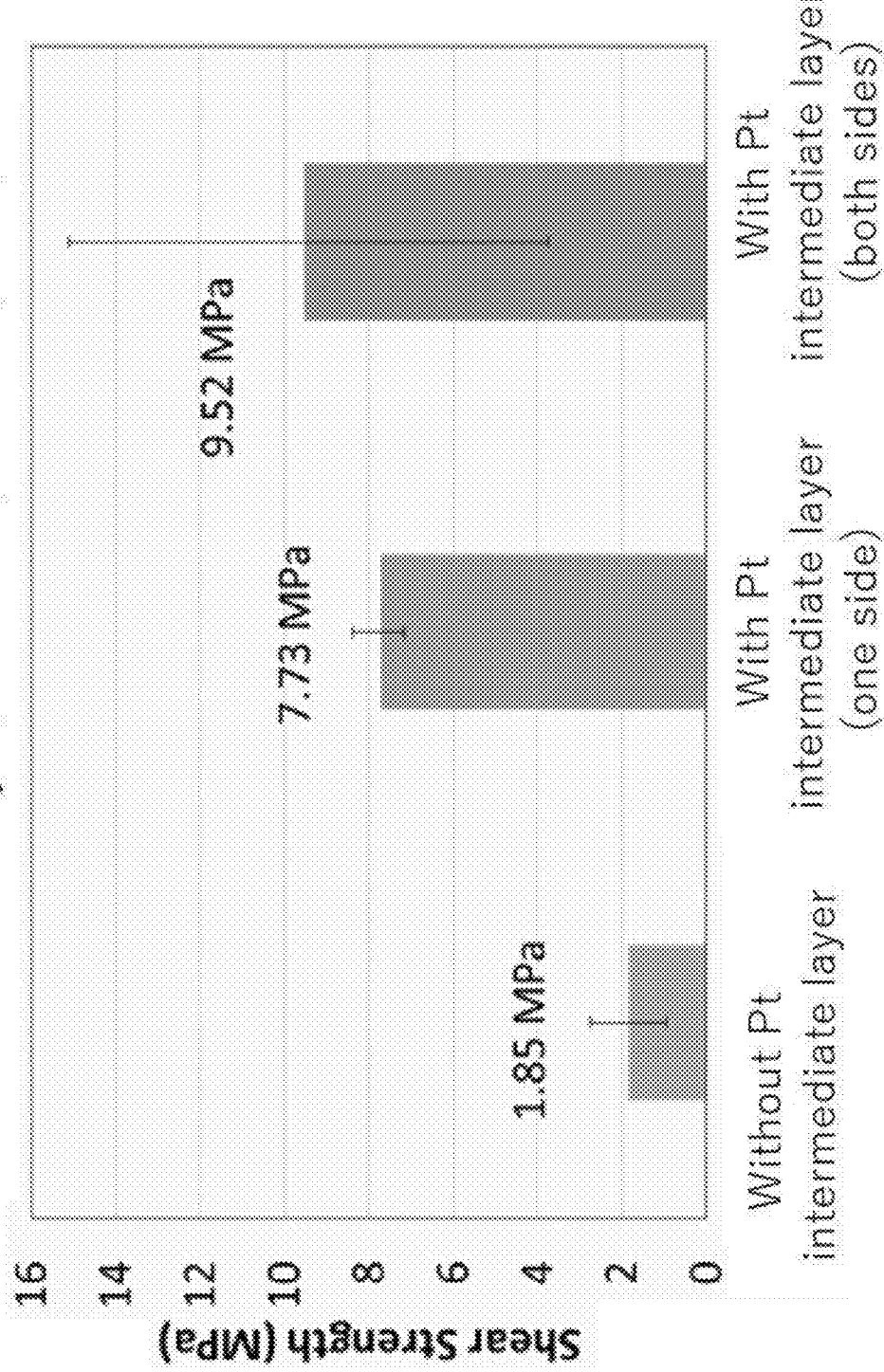
FIG. 3 is die shear strength without Pt ALD film (intermediate layer) or with ALD film formed on one or both sides.

FIG. 3 shows the die shear strength when there is no Pt ALD film or when ALD films are formed on one or both sides.

In the case where no ALD film was deposited, the die shear strength was 1.9 MPa. On the other hand, when the Pt ALD film was deposited only on the bonded surface of the material to be bonded 1, the die shear strength increased to 7.7 MPa. Furthermore, the die shear strength was 9.5 MPa when the Pt ALD film was deposited on the bonded surfaces of both materials to be bonded 1 and 2.

Figure 4:
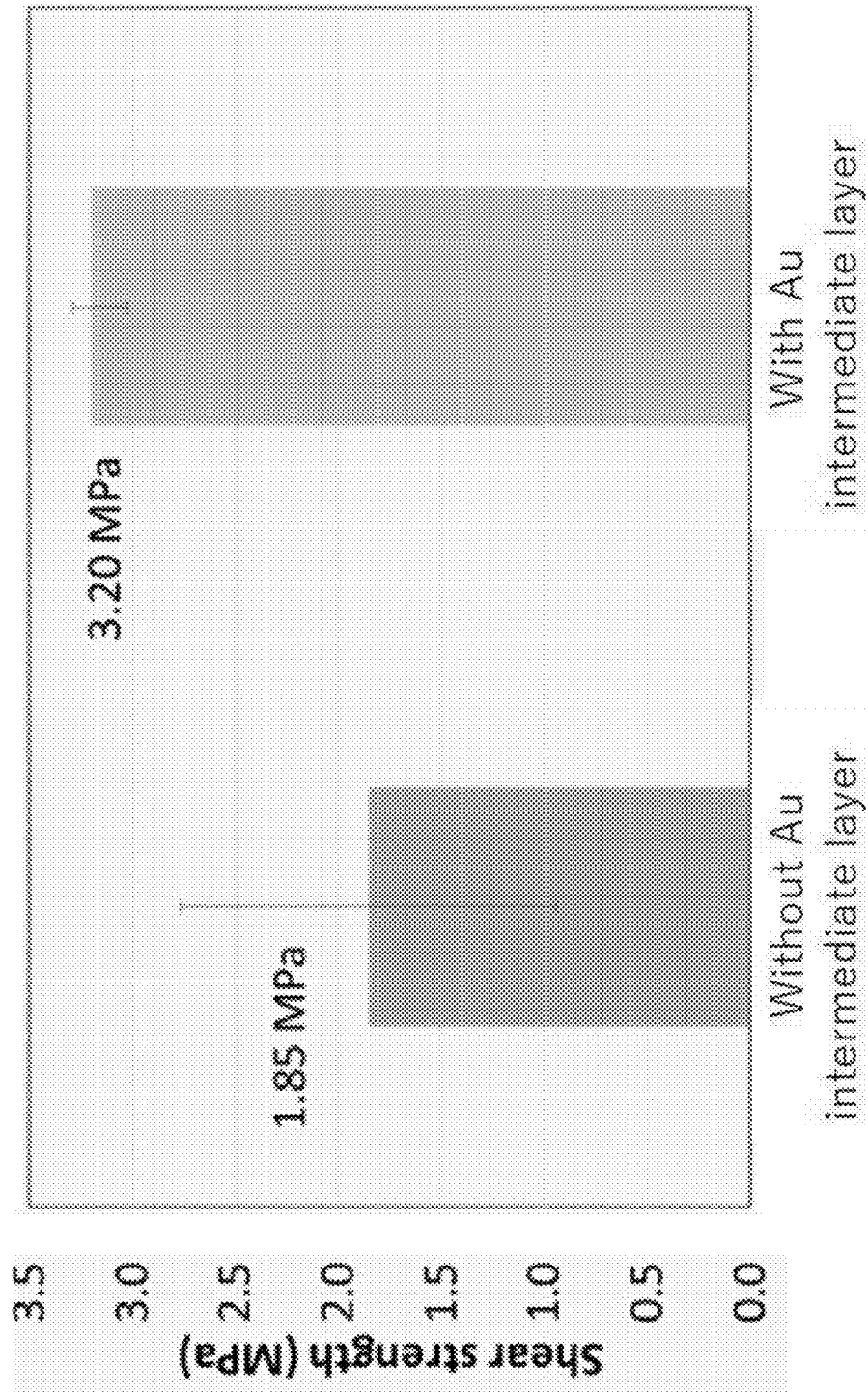
FIG. 4 is die shear strength without ALD film (intermediate layer) of Au, or with ALD film on one or both sides.

FIG. 4 shows the die shear strength without the Au ALD film or with the ALD film on both sides.

In the case where no ALD film was deposited, the die shear strength was 1.85 MPa. In contrast, the die shear strength was 3.20 MPa when a Pt ALD film was deposited on the bonded surfaces of both materials to be bonded 1 and 2.

As shown in the example, it is considered that by providing an ALD film of noble metal, in addition to suppressing oxidation of the materials to be bonded, atomic diffusion between Cu and Cu was promoted while minimizing changes in the composition of the base material, and pseudo-low temperature direct bonding was achieved. On the other hand, when the ALD film of noble metal was not provided as in the comparative example, the die shear strength seems to have been low because the above-mentioned oxide films formed on the surfaces of each of the two materials to be bonded overlapped at the bonding interface and greatly inhibited the atomic diffusion of the metal.

The invention claimed is:

1. A bonding method comprising:
providing two materials to be bonded through respective bonding surfaces, the bonding surfaces of each material having a smooth surface,
forming a thin film of noble metal using an atomic layer deposition method at a vacuum of 1.0 Pa or higher on at least one of the bonding surfaces, wherein the noble metal has a volume diffusion coefficient greater than that of the base materials of the materials to be bonded;
forming a laminate by overlapping the two materials to be bonded so that the bonding surfaces of the two materials are connected through the thin film; and
holding the laminate at a predetermined temperature to bond the two materials together.

2. The bonding method according to claim 1, wherein the thickness of the thin film upon its formation is 100 nm or less.

3. The bonding method according to claim 1, wherein the thin film formed on at least one of the bonding surfaces is formed without a mask using atomic layer deposition.

4. A structure comprising two materials bonded to each other, bonded by the bonding method according to claim 1.

5. A bonding material for use in the bonding method according to claim 1, wherein said thin film is formed on the bonding surface of said material to be bonded.

6. A method of manufacturing the structure, including said two materials to be bonded, bonded by the bonding method according to claim 1.

* * * * *